United States Patent [19]
Ema et al.

[11] Patent Number: 5,789,788
[45] Date of Patent: Aug. 4, 1998

[54] SEMICONDUCTOR DEVICE WITH FIRST AND SECOND WELLS WHICH HAVE OPPOSITE CONDUCTIVITY TYPES AND A THIRD WELL REGION FORMED ON ONE OF THE FIRST AND SECOND WELLS

[75] Inventors: Taiji Ema; Satoru Miyoshi, both of Kawasaki; Tatsumi Tsutsui, Kasugai; Masaya Katayama, Kasugai; Masayoshi Asano, Kasugai; Kenichi Kanazawa, Kawasaki, all of Japan

[73] Assignees: Fujitsu Limited, Kanagawa; Fujitsu VLSI Limited, Aichi, both of Japan

[21] Appl. No.: 754,615

[22] Filed: Nov. 20, 1996

Related U.S. Application Data

[63] Continuation of Ser. No. 345,406, Nov. 21, 1994, abandoned.

[30] Foreign Application Priority Data

Nov. 22, 1993 [JP] Japan ...................... 5-292179

[51] Int. Cl.⁶ ................... H01L 29/76; H01L 29/00
[52] U.S. Cl. ......................... 257/371; 257/529
[58] Field of Search ................... 257/369, 315, 257/371, 296, 529, 530

[56] References Cited

U.S. PATENT DOCUMENTS

| | | | |
|---|---|---|---|
| 5,374,838 | 12/1994 | Sawada et al. | 257/371 |
| 5,404,042 | 4/1995 | Okumura et al. | 257/371 |
| 5,508,957 | 4/1996 | Momodomi et al. | 257/315 |
| 5,514,889 | 5/1996 | Cho et al. | 257/371 |

FOREIGN PATENT DOCUMENTS

2-77153  3/1990  Japan.

*Primary Examiner*—Steven H. Loke
*Attorney, Agent, or Firm*—Armstrong, Westerman, Hattori, McLeland & Naughton

[57] ABSTRACT

Wells of n- and p-type are formed in a p-type substrate. Wells of p-type are also formed in the n-type well. Both the p-type wells are formed by the same process at the same time to make MOS transistors have different threshold voltages. MOS transistors having a long gate length and a low threshold voltage are formed in the p-well in the n-well, and MOS transistors having a short gate length and a high threshold voltage are formed in the p-well at the outside of the n-well. Fuses are formed over the p-type wells in the n-type well at a high density.

26 Claims, 10 Drawing Sheets

SEMICONDUCTOR DEVICE WITH FIRST AND SECOND WELLS WHICH HAVE OPPOSITE CONDUCTIVITY TYPES AND A THIRD WELL REGION FORMED ON ONE OF THE FIRST AND SECOND WELLS

This application is a continuation of application Ser. No. 08/345,406, filed Nov. 21, 1994, now abandoned.

BACKGROUND OF THE INVENTION

1. Field of the Invention

The present invention relates to a semiconductor device, and more particularly to a semiconductor device having various types of semiconductor elements integrated on a single semiconductor chip.

2. Description of the Related Art

A CMOS (complementary metal-oxide-semiconductor) circuit on a single semiconductor chip of a first conductivity type requires at least a well of a second conductivity type opposite to the first conductivity type.

In order to satisfy the conditions such as separation of highly integrated fine or minute elements of a semiconductor device, some semiconductor substrates of a first conductivity type have a well of the first conductivity type and another well of a second conductivity type opposite to the first conductivity type.

FIGS. 9A–9C and 10A–10D show examples of manufacturing techniques of forming two types of wells (twin wells).

Figure 9A:
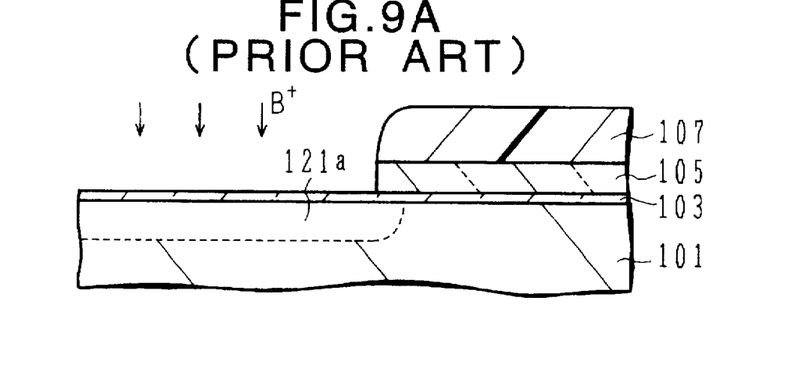
FIGS. 9A–9C are cross sectional views explaining a conventional process of realizing a twin well structure.
Figure 9B:
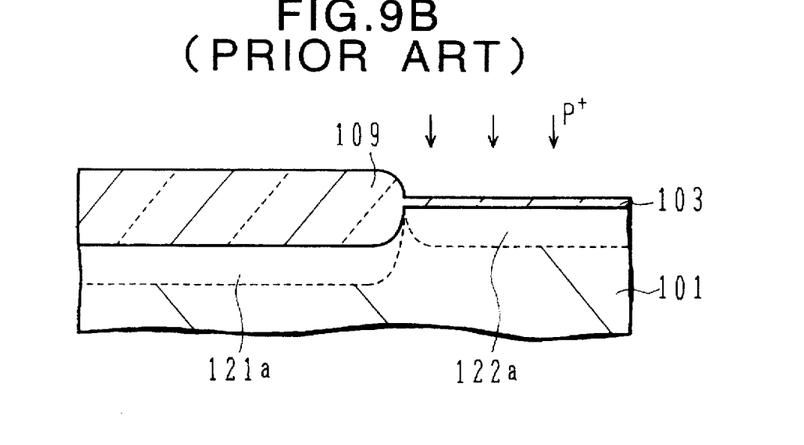
Figure 9C:
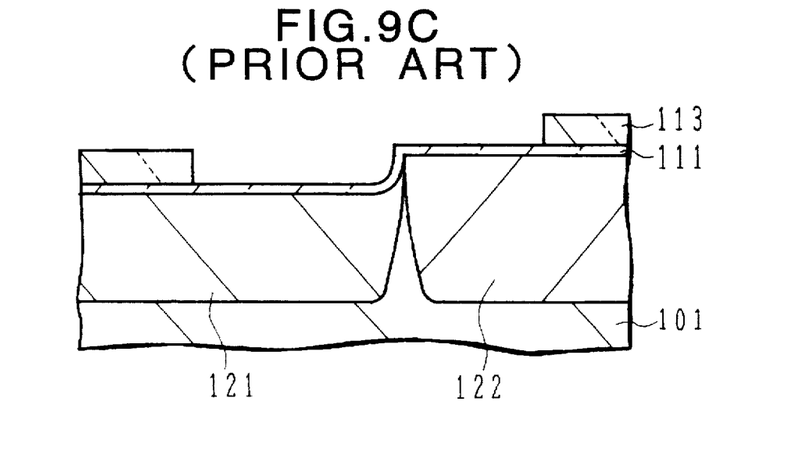

FIGS. 9A–9C show an example of a manufacturing technique of forming n- and p-type wells on a single semiconductor substrate. In this example, a p-type semiconductor substrate is used.

Referring to FIG. 9A, a silicon oxide film 103 is formed on a p-type silicon substrate 101 by thermal oxidation. A silicon nitride film 105 is formed on the silicon oxide film 103 by CVD (chemical vapor deposition). A resist layer is formed on the silicon nitride film 105, exposed and developed so as to form a resist mask 107.

By using the resist mask 107 as an etching mask, the silicon nitride film 105 is selectively etched by dry etching so as to expose the silicon oxide film 103.

By using the patterned resist mask 107 and silicon nitride film 105 as an ion implanting mask, boron (B) ions are implanted into the silicon substrate 101 under the exposed area of the silicon oxide film 103 so as to form a boron implanted region 121a. The number of processes required up to this state are five, including the oxide film forming process, nitride film forming process, mask forming process, etching process, and boron ion implanting process.

Next, as shown in FIG. 9B, the resist mask 107 is removed. Thereafter, by using the silicon nitride film 105 as a mask, a thick silicon oxide film 109 is formed on the exposed area of the silicon oxide film 103 by LOCOS (local oxidation of silicon).

After the LOCOS process, the silicon nitride film 105 used as the oxidation mask is removed. Then, phosphorus (P) ions are implanted under the conditions that the phosphorus ions pass through the silicon oxide film 103 and do not pass through the thick silicon oxide film 109. As a result, a phosphorus ion implanted region 122a is formed only under the exposed area of the thin silicon oxide film 103. The number of processes up to this state shown in FIG. 9B is four, including the resist mask removing process, oxide film forming process, nitride film removing process, and phosphorus (P) ion implanting process.

Next, as shown in FIG. 9C, a drive-in process for implanted impurity ions is performed by subjecting the p-type Si substrate 101 to a thermal treatment. After the drive-in process, the thin silicon oxide film 103 and thick silicon oxide film 109 are removed so that the silicon surface is exposed. The exposed silicon surface is subjected to a light thermal oxidation process to thereby form a thin silicon oxide film 111 on the silicon surface.

Next, a silicon nitride film is formed on the silicon oxide film by CVD, and a resist layer is formed on the silicon nitride film. The resist layer is then exposed and developed so as to form a resist mask. By using this resist mask as an etching mask, the silicon nitride film is selectively etched so as to form a patterned silicon nitride film 113. Thereafter, the resist mask is removed.

The number of processes up to this state is seven, including the drive-in process of implanted impurity ions, oxide film removing process, oxidizing process, nitride film forming process, resist mask forming process, etching process, and resist mask removing process. The total number of processes explained with FIGS. 9A–9C is therefore sixteen.

If an oxidizing process is performed after the state shown in FIG. 9C, a thick silicon oxide film is selectively formed by LOCOS under the area not covered with the silicon nitride film 113.

Another conventional manufacturing technique will be explained with FIGS. 10A–10D, which forms twin wells.

Figure 10A:
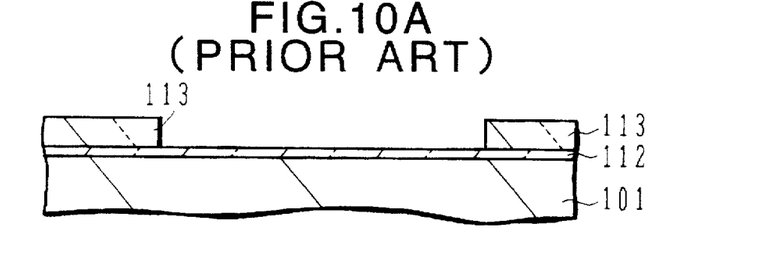
FIGS. 10A–10D are cross sectional views explaining another conventional process of realizing a twin well structure.

As shown in FIG. 10A, a silicon oxide film 112 is formed on the surface of a p-type silicon substrate 101. On the silicon oxide film 112, a silicon nitride film and a resist layer are formed. The resist layer is selectively exposed and developed so as to form a resist mask.

By using this resist mask as an etching mask, the silicon nitride film is selectively etched to form a patterned silicon nitride film 113, and thereafter the resist mask is removed. The number of manufacturing processes up to this state shown in FIG. 10A is five, including the oxide film forming process, nitride film forming process, mask forming process, selective etching process, and resist removing process.

Figure 10B:
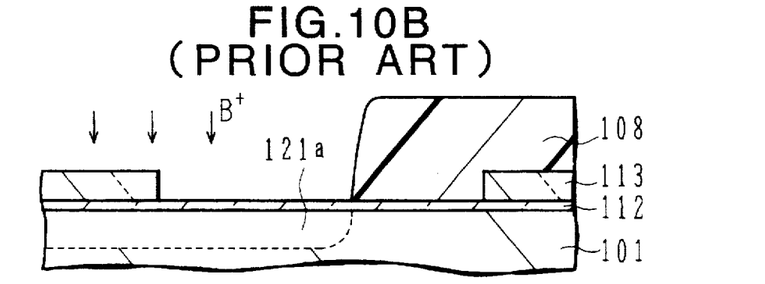

Next, as shown in FIG. 10B, a resist layer is formed on the surface of the silicon substrate 101, and exposed and developed to form a resist mask 108. By using this resist mask 108 as an ion implanting mask, boron (B) ions are implanted into the silicon substrate at the area not covered with the resist mask 108 so as to form a boron (B) ion implanted region 121a.

The number of processes up to the state shown in FIG. 10B is two, including the resist mask forming process and boron ion implanting process.

Figure 10C:
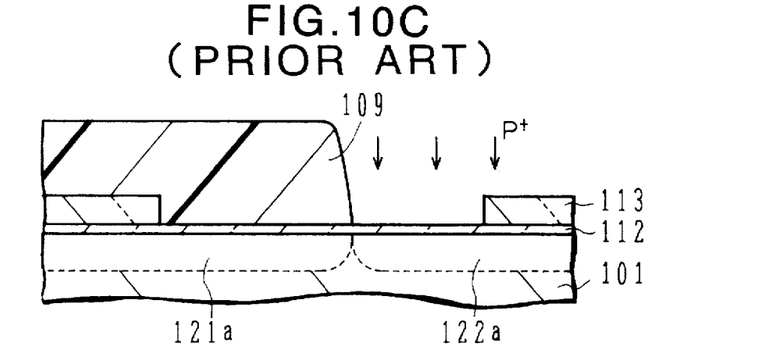

Next, as shown in FIG. 10C, the resist mask 108 used for forming the boron ion implanted region 121a is removed, and a new photoresist layer is formed, exposed and developed so as to form a resist mask 109.

By using this resist mask 109 as an ion implanting mask, phosphorus (P) ions are implanted to form a phosphorus (P) ion implanted region 122a. The number of processes up to this state shown in FIG. 10C is three, including the resist mask removing process, resist mask forming process, and phosphorous (P) ion implanting process.

Figure 10D:
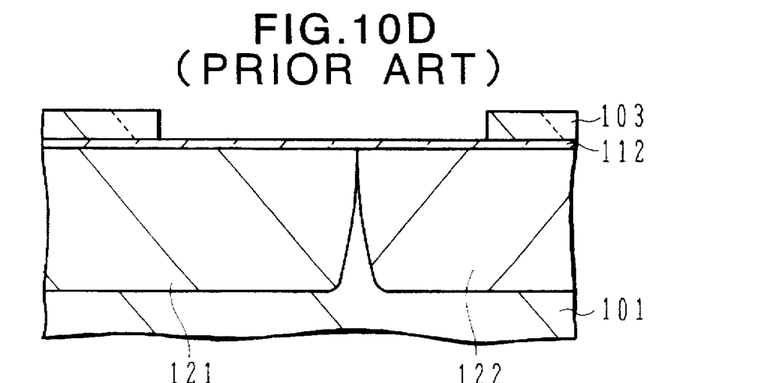

Next, as shown in FIG. 10D, the resist mask 109 is removed and a drive-in diffusion process for implanted impurity ions is performed by heating the silicon substrate 101. The impurity ions implanted at the processes explained with FIGS. 10B and 10C are diffused and activated so as to form a p-type well 121 and an n-type well 122.

The number of processes up to the state shown in FIG. 10D is two, including the resist mask removing process and drive-in diffusion (well running) process. The total number of processes explained with FIGS. 10A–10D is therefore twelve.

With the processes explained with FIGS. 9A–9C and FIGS. 10A–10D, it is possible to form p- and n-type wells having uniform characteristics in a semiconductor substrate.

Even if p- and n-type wells having uniform characteristics are formed in a semiconductor substrate, there is a case where the requirements of a semiconductor device are not satisfied. Such a case occurs when p- and n-type wells electrically isolated from a semiconductor substrate are to be formed.

If wells electrically isolated from the substrate can be formed, the bias conditions of wells can be set independently from each other. A triple well structure has been proposed so as to form wells electrically isolated from the substrate and having the same conductivity type as that of the substrate.

In the triple well structure, on a substrate of a first conductivity type, wells of a second conductivity type opposite to the first conductivity type are formed, and wells of the first conductivity type are formed in some wells of the second conductivity type. For example, on a p-type substrate, n-type wells are formed, and p-type wells are formed in some n-type wells. With this structure, p-type wells in the n-type wells can be electrically isolated from the p-type substrate. P-type wells electrically connected to the substrate may also be formed on the same substrate.

Such a triple well structure can be realized by using a mask forming process, an ion implanting process, and a mask removing process, in addition to the processes explained with FIGS. 9A–9C and FIGS. 10A–10D.

The triple well structure proposed in Japanese Patent Laid-open Publication No.2-77153 has an n-type well formed in an n-type substrate and electrically isolated from the substrate, a p-type well having an impurity concentration suitable for a peripheral circuit, and a p-type well having a high impurity concentration capable of suppressing a leak current between trench capacitors.

Characteristics of semiconductor elements of a semiconductor integrated circuit device are not always the same. For example, a DRAM (dynamic random access memory) includes memory capacitors for storing data and transistors for gating these capacitors, sense amplifiers for detecting data from memory cells and amplifying it, and peripheral circuits including external interface circuits and logic circuits for controlling memory cells and sense amplifiers. The requirements of transistors, particularly n-channel transistors, used for the above circuit elements differ slightly from one another.

The lower the threshold voltage of peripheral circuit transistors and the shorter the channel lengths thereof, the faster the operation of the transistors. However, if a threshold voltage is too low, a leak current in an off-state increases.

A standby current is being supplied to a peripheral circuit during the standby period. The leak current in an off-state occupies the main portion of the total power consumption of a semiconductor integrated circuit device. Reducing a power consumption is a main issue of hand-held computers and the like.

It has been required therefore to suppress the total leak current of peripheral circuit transistors to the order of 100 µA. It is therefore desirable that a threshold voltage is set to be relatively high so as to suppress the leak current and that a channel length is set to be short so as to realize a high speed operation.

A sense amplifier circuit is generally made of flip-flop circuits. A sensitivity of detection and an amplification of a sense amplifier become higher if threshold voltages of transistors constituting the sense amplifier are made lower. No voltage is applied to a sense amplifier in the standby state. Accordingly, the requirements of a low leak current for a sense amplifier and the like are less than those for peripheral circuit transistors. The leak current of a sense amplifier is permitted to be about 100 times that of a peripheral circuit transistor, allowing the threshold voltages of transistors of the sense amplifier to be lowered correspondingly.

It is very important to balance the characteristics of a pair of transistors of a flip-flop circuit. In order to alleviate the adverse effects of process variations, it is better to set a channel length to be slightly longer than a minimum value (minimum pattern width).

A leak current of a memory cell transistor is set as low as possible in order to hold stored charges. The threshold voltage is therefore set to be relatively high.

In summary, it is preferable to set the threshold voltage of a peripheral circuit transistor to be about 0.5 V, the threshold voltage of a sense amplifier transistor to be about 0.3 V, and the threshold voltage of a memory cell transistor to be about 1 V. The channel length of a sense amplifier transistor is preferably set to be longer than that of a peripheral circuit transistor by about 10% or more.

In a semiconductor integrated circuit device such as a memory element, a fuse circuit is formed in some cases so as to provide a redundant circuit or the like. A fuse element is structured, for example, by forming an insulation film on a semiconductor substrate, forming a fuse made of, for example, polycrystalline silicon on the insulation film, and covering the fuse with an interlevel insulation film or the like.

Most of the methods of blowing or cutting a fuse are either an electrical method of blowing a fuse by flowing an over current through the fuse or a laser method of blowing a fuse by applying a laser beam with associated light energy to the fuse.

The electrical method requires many circuits for supplying an over current to the number of fuses to be blown. Therefore, the laser method has been used recently which can easily process a number of fuses.

Not a small number of defects are formed in an insulation film or the like covering the fuse, because the fuse is instantaneously heated to a very high temperature to blow it.

If fuses disposed on a thin insulation film formed on a semiconductor substrate are blown by the laser method, there is a possibility of forming defects in the insulation film and electrically connecting the fuses to the semiconductor substrate. Therefore, different fuses are electrically connected and the chip becomes defective.

In order to avoid such an electrical failure, the insulation film under fuses has been designed to be thick and the power of laser for blowing fuses has been controlled.

A silicon oxide based interlevel insulation film and a silicon nitride based cover film are often formed in this order over fuse elements of a semiconductor integrated circuit device. A silicon nitride film greatly absorbs a laser beam. It is therefore preferable to remove the nitride film on fuse elements. However, the dry etching process of removing a nitride film also etches an oxide film.

If a process of removing the cover film for exposing a bonding pad on the interlevel insulating film is performed at the same time when the nitride film on fuse elements is removed, this dry etching process is required to fully remove the nitride film on the fuse elements.

In such a case, the interlevel insulation film under the nitride film is etched inadvertently so that the thickness of the interlevel insulation film becomes irregular. With the above-described fuse element structure, it is not easy to blow fuses with a minimum laser power.

Another fuse element structure having a diffusion region on the surface of a semiconductor substrate has also been proposed in order to prevent different fuses from being electrically connected even if defects are formed in an insulation film under the fuses. Even if defects are formed in the insulation film under the fuses and the fuses are electrically connected to the semiconductor substrate, electrical connection between fuses can be avoided if the diffusion region is electrically separated from the semiconductor substrate. In this case, the integration density of fuses depends on the integration density of diffusion regions under fuses.

As described above, there are a variety of requirements of semiconductor elements of a semiconductor integrated circuit device. If well regions having a variety of characteristics are formed so as to meet such requirements, the manufacturing processes become complicated, increasing the cost of a semiconductor integrated circuit device.

SUMMARY OF THE INVENTION

It is an object of the present invention to provide a semiconductor integrated circuit device capable of satisfying the requirements of various semiconductor elements of a semiconductor integrated circuit device without increasing the manufacturing cost.

It is another object of the present invention to provide a method of manufacturing a semiconductor device having a well structure capable of satisfying the requirements of various semiconductor elements without increasing the manufacturing cost.

According to one aspect of the present invention, there is provided a semiconductor device having memory cells for storing data, a sense amplifier circuit for detecting and amplifying memory cell data, and a peripheral circuit for controlling the memory cells and the sense amplifier circuit, the semiconductor device comprising: a semiconductor substrate of a first conductivity type having a main surface; a first well region formed on the main surface of the semiconductor substrate, the first well region being of a second conductivity type opposite to the first conductivity type; a second well region formed on the main surface of the semiconductor substrate at the outside of the first well region, the second well region being of the first conductivity type; a third well region formed on the main surface of the semiconductor substrate at the inside of the first well region, the third well region being of the first conductivity type; a first peripheral circuit region including MIS transistors formed in the second well region; and a sense amplifier circuit region including MIS transistors formed in the third well region.

According to another aspect of the present invention, there is provided a semiconductor device comprising: a semiconductor substrate of a first conductivity type having a main surface; a fifth well region formed on the main surface of the semiconductor substrate, the fifth well region being of a second conductivity type opposite to the first conductivity type; a plurality of sixth well regions of the first conductivity type formed in the fifth well region; an insulation film formed on the main surface of the semiconductor substrate over the fifth well region; and fuses formed on the insulation film over at least some of the sixth well regions.

According to a further aspect of the present invention, there is provided a method of manufacturing a semiconductor device comprising the steps of: forming a first impurity implanting mask having a first opening on the main surface of a semiconductor substrate of a first conductivity type; implanting impurities of a second conductivity type opposite to the first conductivity type under the main surface under the first opening by using the first impurity implanting mask; forming a second impurity implanting mask on the main surface, the second impurity implanting mask having second and third openings corresponding in position to the outside and inside of the first opening; and implanting impurities of the first conductivity type under the main surface under the second and third openings by using the second impurity implanting mask.

The second and third wells can be formed by the same process. The effective impurity concentration of the third well lowers by an amount corresponding to an impurity concentration of the first well so that the third well has a lower impurity concentration than the second well.

Of MOS transistors formed in the second and third wells by the same processes, the MOS transistors in the third well have a lower threshold voltage than that of the MOS transistors in the second well.

Since the second and third wells can be formed by the same process, MOS transistors having different characteristics can be formed without complicating the manufacturing processes.

The sixth well under a fuse in the fifth well similar to the third well in the first well can be made small in size. Assuming the same well dimension, a breakdown voltage between sixth wells can be raised more than that between wells directly formed in a semiconductor substrate.

As described above, semiconductor elements satisfying various requirements can be integrated on a semiconductor substrate by forming triple wells by using two masks.

For example, in a DRAM device, MOS transistors of a sense amplifier circuit can be formed which have a longer gate length and a lower threshold voltage than those of MOS transistors of a peripheral circuit.

In a fuse circuit, a breakdown voltage between fuses can be raised and an integration density of fuses can be improved.

DETAILED DESCRIPTION OF THE PREFERRED EMBODIMENTS

Figure 1A:
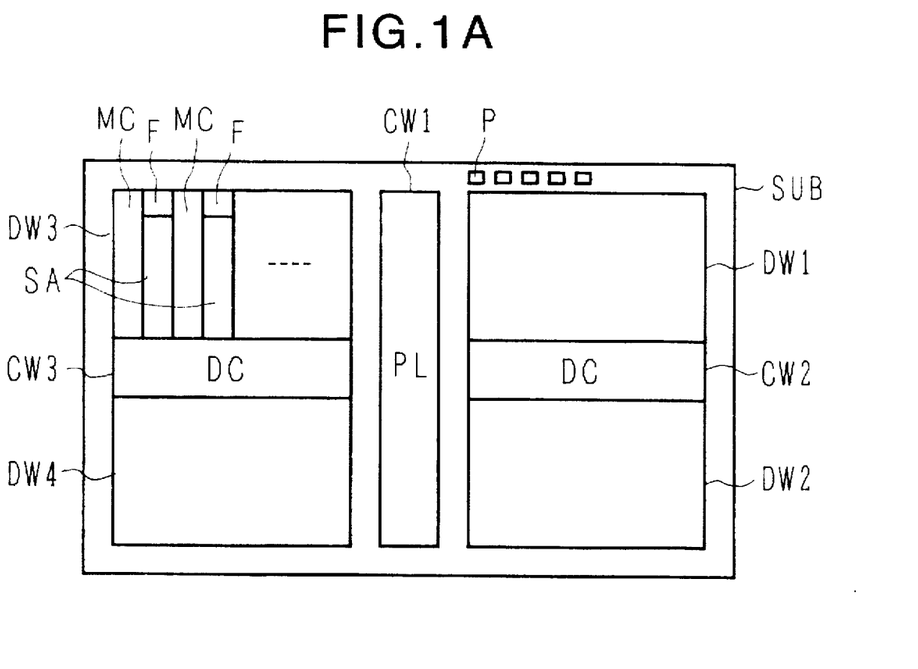
FIGS. 1A and 1B are a top view and a graph explaining a semiconductor device according to an embodiment of the invention.

Semiconductor devices according to the embodiments of the invention will be described. FIG. 1A is a top view of a chip of a semiconductor device. A semiconductor substrate SUB is made of, for example, p-type silicon having a resistivity of 10 Ωm.

A complementary well region CW1 including p-and n-type wells for forming a peripheral logic circuit PL is disposed vertically at the central area of the semiconductor substrate SUB. Pads P are disposed at the chip peripheral area.

Complementary well regions CW2 and CW3 including p- and n-type wells for forming a decoder circuit DC such as a row decoder are also disposed at the central areas of the right and left sides of the semiconductor substrate SUB.

Double well regions DW1, DW2, DW3, and DW4 are disposed at the upper and lower areas of the right and left sides of the semiconductor substrate SUB. Each double well region has a necessary number of p-wells in a large n-type well.

For example, the double well region DW3 has memory cell regions MC formed in p-type wells in the n-type well, fuse regions F having fuse elements formed in p-wells in the n-type well, CMOS circuits formed in n- and p-type wells, and sense amplifier regions SA having sense amplifiers.

The p-type well of the double well region DW and the p-type well in the complementary CW are formed by the same process. Therefore, the p-type well formed in the sense amplifier region SA of the double well region DW has a lower impurity concentration and a shallower depth than those of the p-type well of the complementary well region CW. With the low impurity concentration, it becomes possible to form MOS transistors having a low threshold voltage.

The p-type well of the fuse region F can be made shallow and small in dimension. Therefore, the fuse regions can be formed at a high density and fuse elements can be highly integrated on the fuse regions.

Figure 1B:
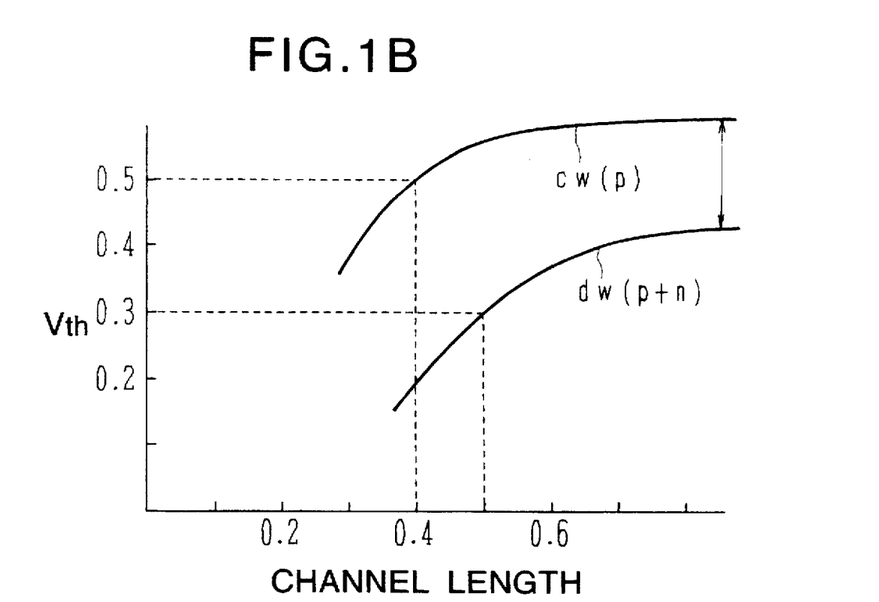

FIG. 1B shows a relationship between a channel length and threshold voltage of a transistor in a p-type well directly formed in a p-type substrate, and a relationship between a channel length and threshold voltage of a transistor in a p-type well formed in an n-type well of the p-type substrate. The abscissa represents a channel length in μm, and the ordinate represents a threshold voltage Vth of a MOS transistor.

A curve cw indicates a threshold voltage of a transistor in the p-type well directly formed in the p-type substrate. A curve dw indicates a threshold voltage of a transistor in the p-type well formed in the n-type well of the p-type substrate. The p-type well in the n-type well has a p-type impurity concentration lower by the amount corresponding to that of the n-type well, so that the curve dw positions lower than the curve cw.

Assuming that the impurity concentration is constant, there is a finite relationship between the threshold voltage and channel length, showing a tendency that the threshold voltage becomes high as the channel length becomes long.

It is preferable that a peripheral circuit transistor has a threshold voltage sufficiently high for suppressing a leak current and a channel length as short as possible.

A channel length of a peripheral transistor is set to a proper value, for example, a minimum pattern width. A channel length of a transistor of a sense amplifier circuit is preferably set longer than the former for providing good balance and stable operation. In this case, assuming that the impurity concentration changes in accordance with a finite curve, the threshold voltage of a MOS transistor becomes high as the channel length becomes long.

It is preferable that a sense amplifier circuit transistor has a lower threshold voltage than that of a peripheral circuit transistor, because the requirement of a leak current of the former transistor is weaker than the latter transistor. However, this condition cannot be satisfied and the undesired results occur if well regions having the same impurity concentration are used.

As shown in FIG. 1A, by using the p-type well directly formed in the p-type substrate and the p-type well formed in the n-type well of the p-type substrate, p-type wells having a different impurity concentration can be obtained without increasing the number of manufacturing processes.

By using the p-well having a high impurity concentration for the peripheral circuit and by using the p-well having a low impurity concentration for n-channel transistors of the sense amplifier circuit, it is possible to provide an optimum design of transistors of the sense amplifier circuit and peripheral circuit in accordance with the two different characteristics of the p-wells.

More specifically, the channel length of an n-channel transistor of the peripheral circuit is determined so as to provide a sufficient threshold voltage in accordance with the curve cw shown in FIG. 1B, and an n-channel transistor of the sense amplifier having a larger channel length than the peripheral circuit is designed in accordance with the curve dw. In this manner, the threshold voltage of the n-channel transistor of the sense amplifier circuit can be made lower than that of the n-channel transistor of the peripheral circuit.

It is desired that a p-well for the fuse region F is to be formed as small as possible. It is possible to reduce the size of the p-well under each fuse element of the fuse region F by using the p-type well in the n-type well.

Figure 2:
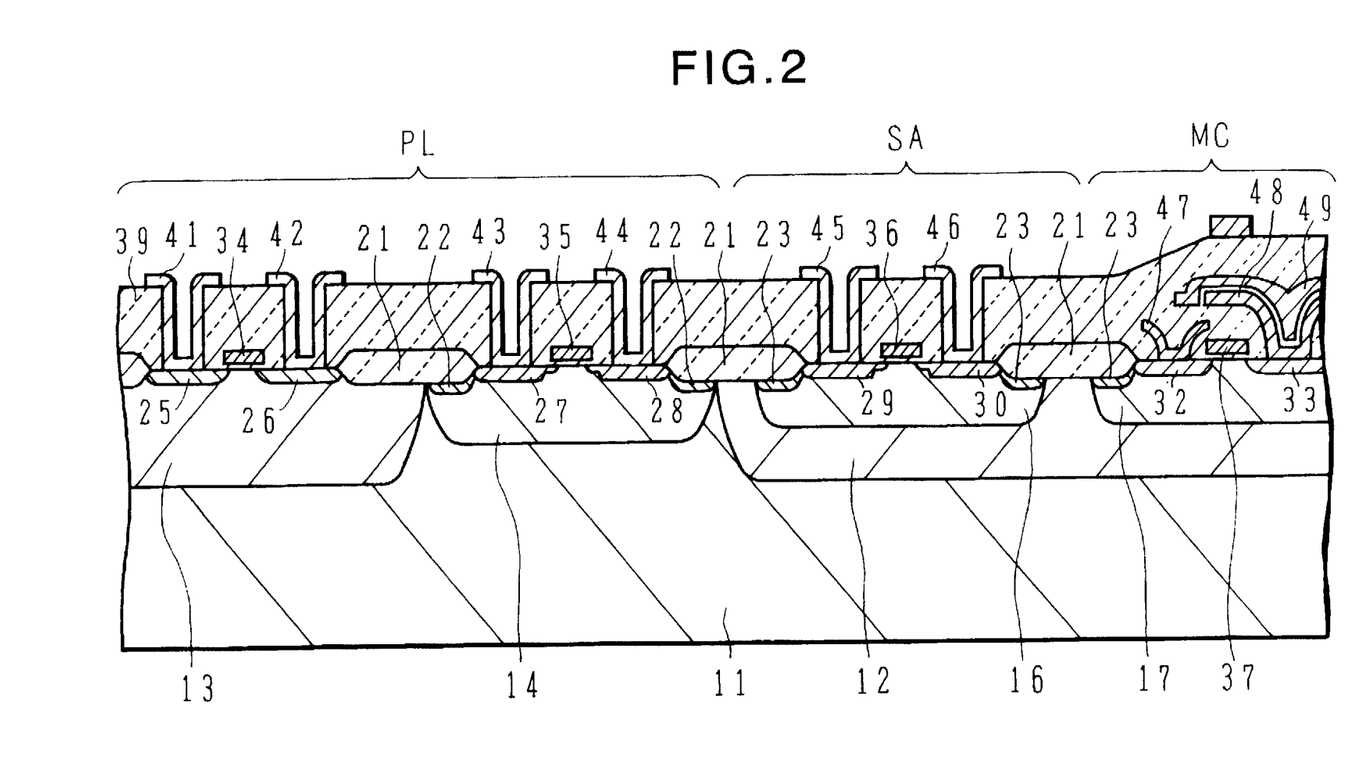
FIG. 2 is a cross sectional view showing an example of the structure of the semiconductor device shown in FIG. 1A.

FIG. 2 is a schematic cross sectional view showing an example of the structure of the semiconductor memory device shown in FIG. 1A. For the simplicity of description, the typical structures of the peripheral circuit region PL, sense amplifier region SA, and memory cell region MC are shown being disposed side by side.

On the main surface of a p-type silicon substrate 11, n-type wells 12 and 13 are formed. A p-type well 14 is formed at the outside of the n-type wells 12 and 13, and p-type wells 16 and 17 are formed at the inside of the n-type well 12. The p-type wells 14, 16, and 17 are formed by the same process.

In the p-type wells 16 and 17, n- and p-type impurities are mixed each other so that the effective impurity concentration of the p-type wells 16 and 17 becomes lower than that of the p-type well 14. Even if the same mask is used, the p-type wells 16 and 17 are made shallower and smaller in size than the p-type well 14.

The peripheral area of each well is covered with a field oxide film 21. P-type regions 22 having a high impurity concentration are formed as channel stop regions under the field oxide film 21 of the p-type well 14. Similarly, p-type regions 23 having a high impurity concentration are formed as channel stop regions under the field oxide films 21 of the p-type wells 16 and 17 in the n-type well 12.

Gate electrodes 34, 35, 36, and 37 such as polycrystalline silicon are formed on the surfaces of the well regions 13, 14, 16, and 17, with gate oxide films being interposed therebetween. Source/drain regions 25, 26, 27, 28, 29, 30, 32, and 33 are formed on both the sides of these gate electrodes through ion implantation. The source/drain regions 27, 28, 29, and 30 in the p-type wells 14 and 16 are formed to have a LDD (lightly doped drain) structure.

A bit line 47 is connected to the source region 32 of the memory cell region MC. The bit line has a laminated structure of a tungsten silicide layer formed on a polycrystalline silicon layer.

An electrode 48 of a memory cell capacitor is connected to the drain region 33 of the transistor in the memory cell region, facing an opposite electrode 49 over a thin insulation film. The electrodes 48 and 49 are made of, for example, polycrystalline silicon.

An interlevel insulation film 39 is formed on the surface of the semiconductor substrate 11, embedding gate electrodes, bit lines, and cell capacitors. The interlevel insulation film 39 is made of, for example, phospho-silicate glass (PSG), boron silicate glass (BSG), boron phosphosilicate glass (BPSG), or the like.

Openings are formed in the interlevel insulation film at predetermined positions to expose the surface of the semiconductor substrate. Electrodes 41, 42, 43, 44, 45, and 46 are formed in the openings. These electrodes 41 to 46 have ohmic contacts with the source/drain regions 25 to 30 of MOS transistors under the electrodes. A wiring is formed on the interlevel insulation film over the memory cell region MC.

With the above structure, a MOS transistor having a lower threshold voltage and a longer gate (i.e. channel) length than the MOS transistor in the p-type well 14 can be formed in the p-type well 16.

An example of the processes of realizing the structure shown in FIG. 2 will be described with reference to FIGS. 3A to 3C, 4A, 4B, 5A, and 5B.

Figure 3A:
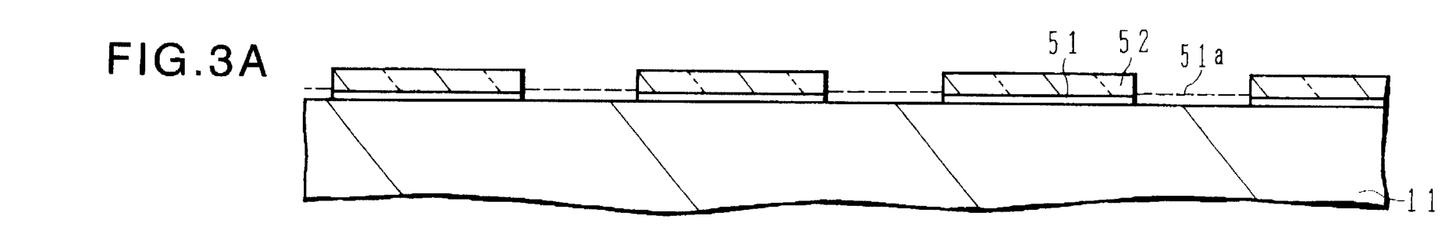
FIGS. 3A–3C, 4A, 4B, 5A, and 5B are cross sectional views explaining a process of realizing the structure shown in FIG. 2.

As shown in FIG. 3A, an $SiO_2$ film 51 is formed on the surface of a p-type silicon substrate 11 having a resistivity of 10 $\Omega$m to a thickness of about 5 nm by thermal oxidation.

Next, an $Si_3N_4$ film 52 is grown to a thickness of about 115 nm by CVD (chemical deposition). A photoresist film is formed over these films 51 and 52 and patterned to form a photoresist mask by photolithography.

By using this resist mask as an etching mask, the $Si_3N_4$ film 52 and $SiO_2$ film 51 are patterned at the same time through reactive ion etching (RIE) by using $CHF_3+CF_4+Ar$ as an etching gas.

An $SiO_2$ film 51a may be formed thereafter to a thickness of about 10 nm on the exposed silicon surface by thermal oxidation.

Figure 3B:
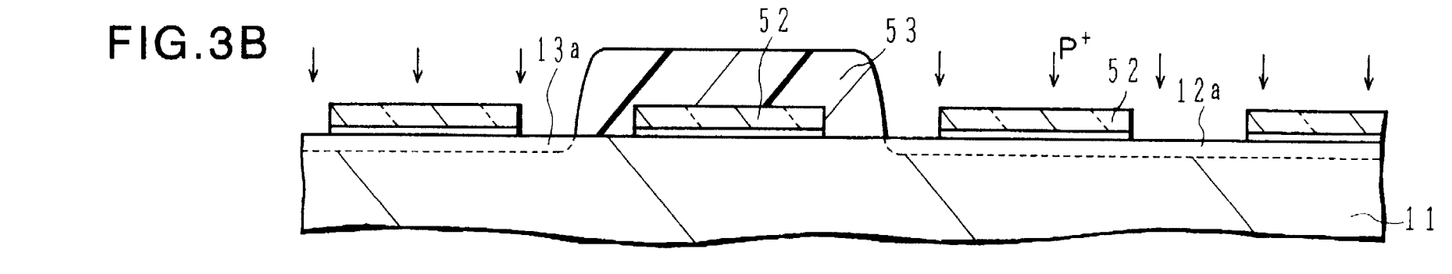

As shown in FIG. 3B, a resist layer is coated over the silicon substrate 11 having the patterned $Si_3N_4$ film 52, and exposed and developed to form a resist mask 53 covering the area excepting the area where an n-type well is formed.

By using this resist mask 53 as an ion implanting mask, phosphorus (P) ions are implanted into the silicon substrate 11 at an acceleration voltage of 180 keV and a dose of about $1.7 \times 10^{13}$ cm$^{-2}$. The implantation energy is set so as to make ions pass through the $Si_3N_4$ film 52 and $SiO_2$ film 51.

With the implantation of P ions, P implanted regions 12a and 13a are formed in the areas not covered with the resist mask 53. After the ion implantation, the resist mask 53 is removed.

Figure 3C:
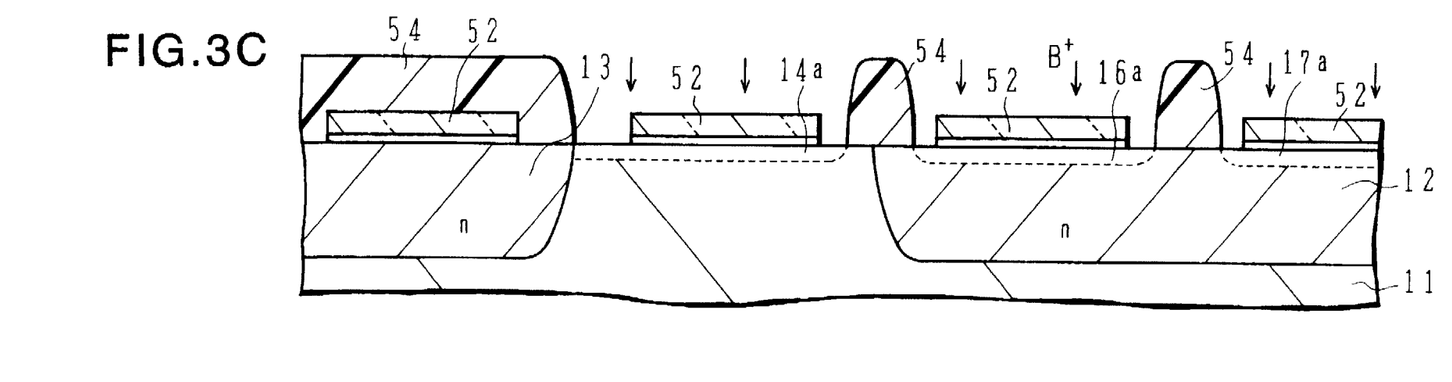

As shown in FIG. 3C, the silicon substrate 11 undergoes a thermal treatment for about 300 minutes at a temperature of 1150° C. in a nitrogen atmosphere so as to diffuse implanted P ions and form n-type wells 12 and 13. After this drive-in diffusion process, a resist layer is again formed on the surface of the silicon substrate 11, and exposed and developed to form a resist mask 54 covering the area excepting the area where a p-type well is formed.

Next, boron (B) ions are implanted at an acceleration voltage of 180 keV and a dose of about $1.6 \times 10^{13}$ cm$^{-2}$. The implantation energy is set so as to make B ions pass through the $Si_3N_4$ film and $SiO_2$ film. B implanted regions 14a, 16a, and 17a are formed therefore in the area not covered with the resist mask 54. After the B ion implantation, the resist mask 54 is removed.

Figure 4A:
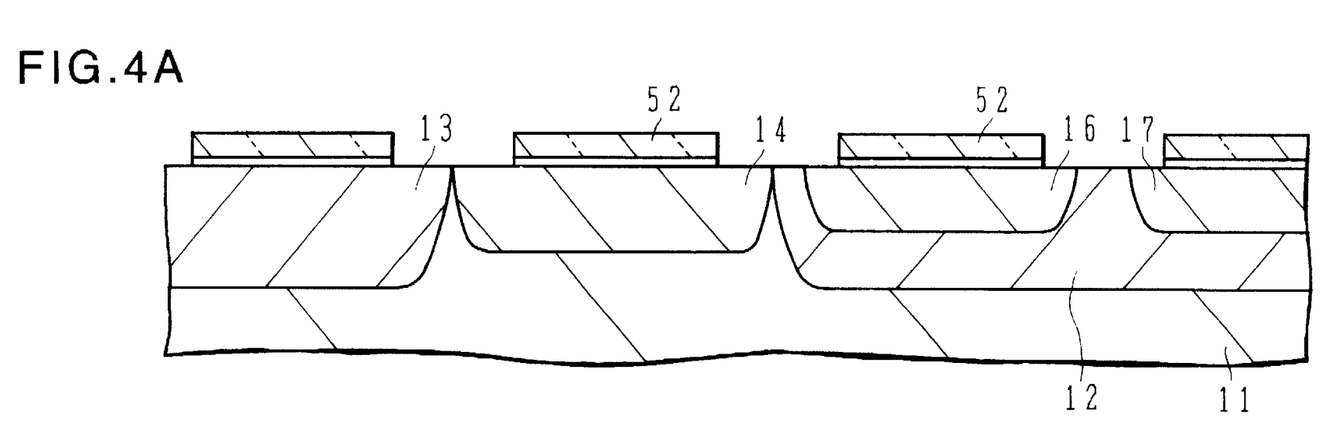

As shown in FIG. 4A, the B ion implanted silicon substrate 11 undergoes a thermal treatment for about 60 minutes at a temperature of 1150° C. in a nitrogen atmosphere so as to diffuse implanted B ions and form p-type wells 14, 16, and 17.

In this manner, there are formed the n-type well 13 for forming p-channel transistors of the peripheral circuit (similar n-type well for forming p-channel transistors of the word line select circuit), the p-type well 14 for forming n-channel transistors of the peripheral circuit, the p-type well 16 for forming n-channel transistors of the sense amplifier circuit, the p-type well 17 for forming memory cells, the broad n-type well 12 containing the p-type wells 16 and 17, and other similar wells.

The surface dose of about $1.7 \times 10^{13}$ cm$^{-2}$ for implanting P ions and forming the n-type well 12 is larger than the surface dose of about $1.6 \times 10^{13}$ cm$^{-12}$ for implanting B ions and forming the p-type wells 16 and 17 in the n-type well 12. However, the concentration in the n-type well 12 is lowered by the drive-in diffusion performed prior to the implantation of B ions. Therefore, the p-type wells 16 and 17 are formed in the areas where B ions are implanted.

By properly selecting the impurity concentration of the p-type wells 16 and 17 and the impurity concentration of the n-type well 12, it becomes possible to lower the impurity concentration of the p-type wells 16 and 17 and to make the depths of the p-type wells 16 and 17 shallower and the size thereof smaller than the mask openings.

Two masks are used by the manufacturing processes described above. The number of masks is not increased more than that of conventional twin well manufacturing processes, and only one thermal treatment for well diffusion is added.

Figure 4B:
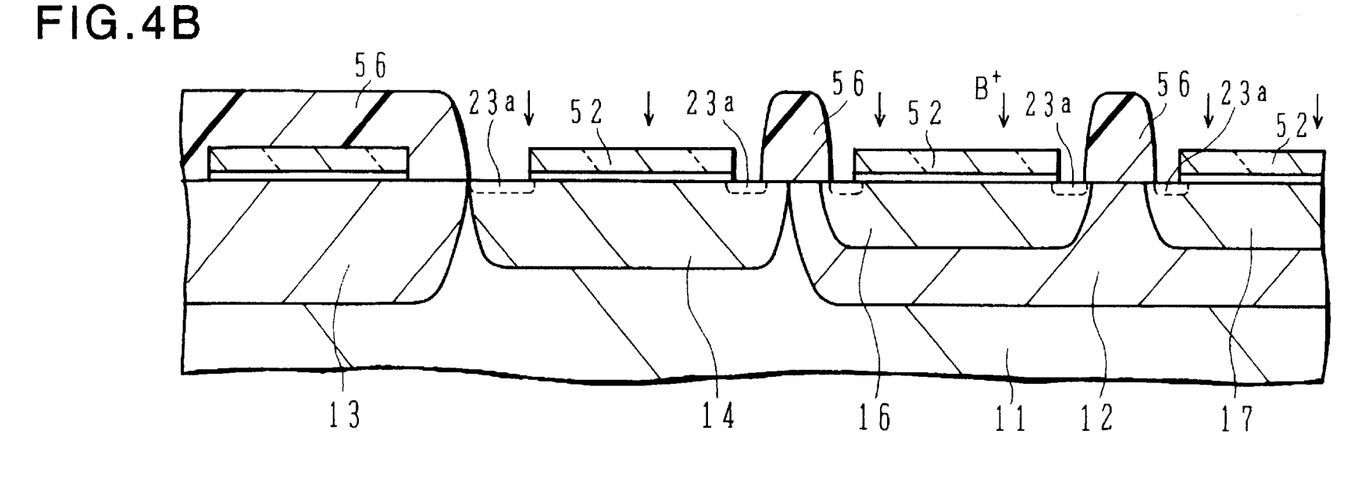

Next, as shown in FIG. 4B, a resist layer is formed over the surface of the silicon substrate 11, and exposed and developed to form a resist mask 56 exposing the p-type well region.

By using this resist mask 56 as an ion implanting mask, B ions are implanted at an acceleration voltage of 18 keV and a dose of about $5 \times 10^{13}$ cm$^{-2}$. This acceleration energy is set so as not to make B ions pass through the nitride film 52.

These impurity ions are so-called channel stop impurity ions. A B implanted region 23a is therefore formed. After the ion implantation, the resist mask 56 is removed.

Figure 5A:
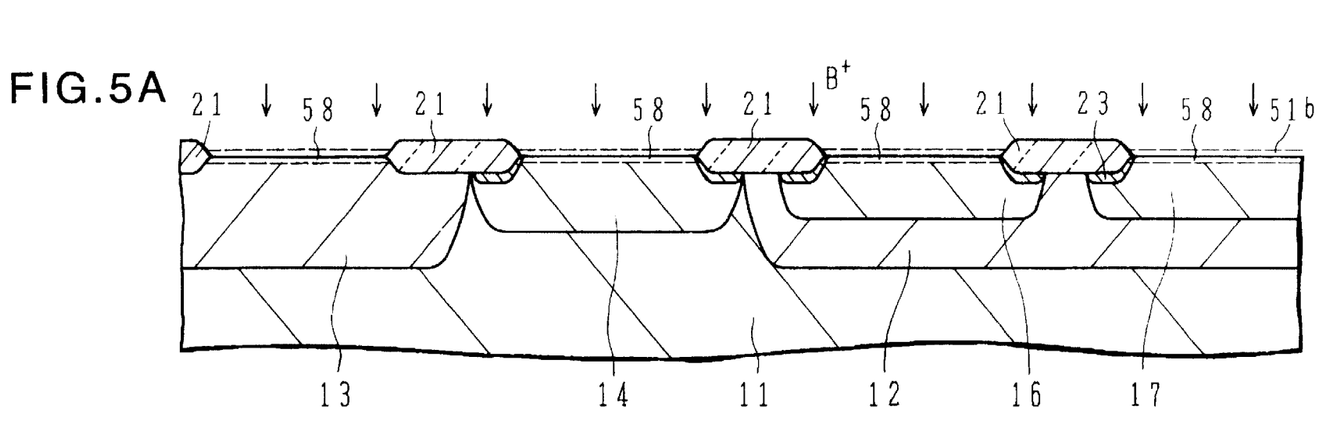

As shown in FIG. 5A, the silicon substrate 11 undergoes a thermal treatment at a temperature of 900° C. in a wet atmosphere. With this thermal treatment, a field oxide film 21 is formed to a thickness of about 350 nm.

During the field oxide film forming process, the implanted B ions are diffused and activated to form channel stop regions 23. Thereafter, the $Si_3N_4$ film 52 and underlying $SiO_2$ film 51 used as the mask during the oxide film forming process are removed. The exposed whole surface of the silicon substrate undergoes a thermal oxidation to grow an $SiO_2$ film 51b to a thickness of about 10 nm.

Next, B ions for controlling the threshold voltages of MOS transistors are implanted under the whole surface of the silicon substrate 11 at an acceleration voltage of about 18 keV and a dose of about $1.8 \times 10^{12}$ $cm^{-2}$. After the ion implantation, the thin $SiO_2$ film 51b is removed.

Figure 5B:
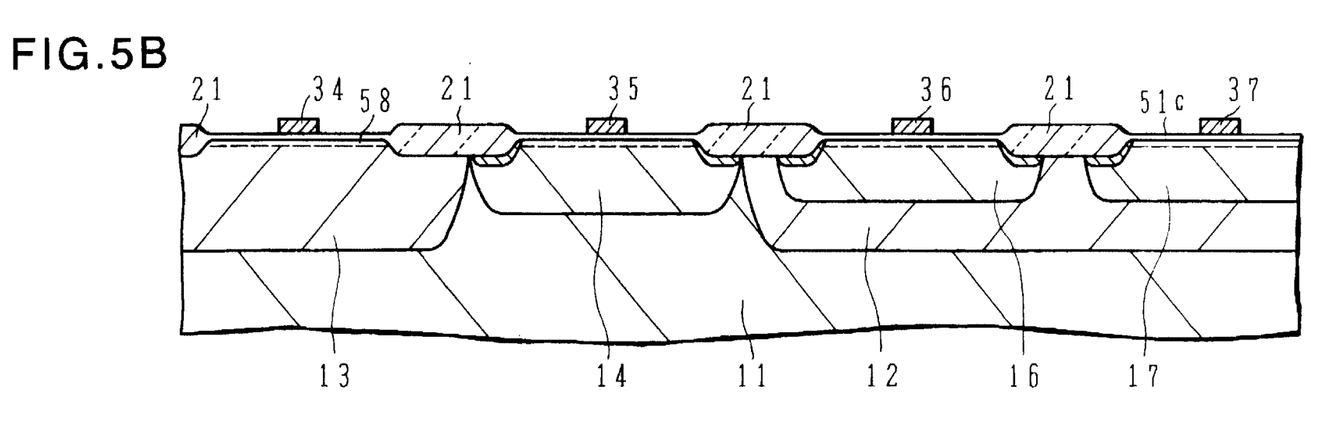

Next, as shown in FIG. 5B, the silicon substrate 11 is oxidized at a temperature of 1050° C. in an atmosphere of $Ar+HCl+O_2$ to grow a gate oxide film 51c to a thickness of about 12 nm.

Thereafter, an amorphous silicon layer doped with P ions is grown over the silicon substrate to a thickness of about 150 nm by CVD. A resist layer is formed on the amorphous silicon layer, exposed and developed to form a resist mask. The amorphous silicon layer is selectively removed by reactive ion etching (RIE) to pattern gate electrodes 34 to 37. In this manner, the gate electrodes of the MOS transistors and their underlying channel regions are formed.

Thereafter, by using the gate electrodes 34 to 37 and field oxide film 21 as a mask, ions are implanted to form the source/drain regions of the MOS transistors.

Oxides may be formed at the side walls of the gate electrodes by CVD and RIE and ions are implanted to form an LDD transistor structure.

At the memory cell region, a polycrystalline silicon region separated by an insulation film is formed for forming a stack type memory capacitor over the drain region.

The above manufacturing processes can use conventional well known manufacturing processes. In the above manner, the semiconductor structure shown in FIG. 2 can be realized.

For the finished semiconductor device, an external VCC voltage (5 V) is applied to the n-type wells 12 and 13, an internally generated VPP voltage is applied to the n-type well containing a word line select transistor not shown in FIG. 2, an external VSS voltage (0 V) is applied to the p-type well 14 and to the p-type well 16 of the sense amplifier region, and an internally generated VBB voltage (-2 V) is applied to the p-type well 17 of the memory cell region.

The ion implantation doses at the manufacturing processes were determined in the following manner. If the concentration of the n-type well is too low, a parasitic MOS transistor is formed requiring an addition of p-channel stop impurities. Therefore, a minimum dose is determined which prevents the formation of parasitic transistors.

This minimum dose is affected by an element separation width and the thermal treatment for forming source/drain regions, and is generally about 1 to $2 \times 10^{13}$ $cm^{-2}$. In the case of a 64 Mb DRAM, the minimum dose was $1.5 \times 10^{13}$ $cm^{-2}$. In the case of a 16 Mb DRAM, the minimum dose was about $1 \times 10^{13}$ $cm^{-2}$.

The impurity dose of the n-type well was determined from the minimum dose while taking some margin into consideration. The minimum dose of the embodiment was therefore determined to be $1.7 \times 10^{13}$ $cm^{-2}$.

It is preferable to implant channel impurities once for all MOS transistors for controlling the threshold voltages. From this viewpoint, the channel impurity ion dose was determined so as to set the threshold voltage of p-channel transistors to be a desired value of 0.8 V.

The channel impurity ion dose was therefore determined to be $1.8 \times 10^{12}$ $cm^{-2}$. The implantation of channel impurity ions may be performed before or after the formation of gate oxide films.

Next, under the condition of the channel impurity ion dose of $1.8 \times 10^{12}$ $cm^{-2}$, the p-type well dose was determined so as to make the MOS transistor having a gate length of 0.4 µm have a desired threshold voltage of 0.5 V. The p-type well dose was therefore determined to be $1.6 \times 10^{13}$ $cm^{-2}$.

After the doses of the n- and p-type wells were determined in the above manner, a plurality of transistors having a different gate length were formed in the p-type well in the n-type well, and their threshold voltages were measured.

A transistor having a desired threshold voltage of 0.3 V was selected from the plurality of transistors, and the gate length thereof was set to be the gate length of an n-channel transistor of the sense amplifier circuit to be formed in the p-type well in the n-type well. As a result, the gate length of the n-channel transistor of the sense amplifier circuit was determined to be 0.5 µm longer by 0.1 µm than that of the n-channel transistor of the peripheral circuit.

A desired threshold voltage of the memory cell transistor was determined while taking into consideration the narrow channel effect to be caused by a lateral diffusion of channel stop impurities and the back bias effect to be caused by the application of a negative bias voltage to the substrate for suppressing leak current of a parasitic transistor and preventing data destruction by external noises. The channel stop dose of $5 \times 10^{13}$ $cm^{-2}$ and a substrate bias voltage of -2V were therefore determined.

One of the factors to be considered in determining an n-type well dose is a difference between a threshold voltage of a p-channel parasitic transistor and a threshold voltage of an n-type transistor of the peripheral circuit and sense amplifier circuit. A simple process design does not always result in that the dose determined from the former is the same as that determined from the latter.

The short channel effect of a transistor is sensitive to the well and channel impurity concentrations. The short channel effect of a sense amplifier transistor having substantially the low impurity concentration becomes severe. In order to alleviate this effect, it is preferable that the channel lengths of the peripheral circuit transistor and sense amplifier transistor are set differently.

Specifically, it is preferable that the channel length of the sense amplifier transistor is set longer than that of the peripheral circuit transistor. This setting also satisfies the requirements of suppressing a variation between threshold voltages of a transistor pair constituting a flip-flop circuit.

In the above description, a fuse circuit has been omitted.

Figure 6:
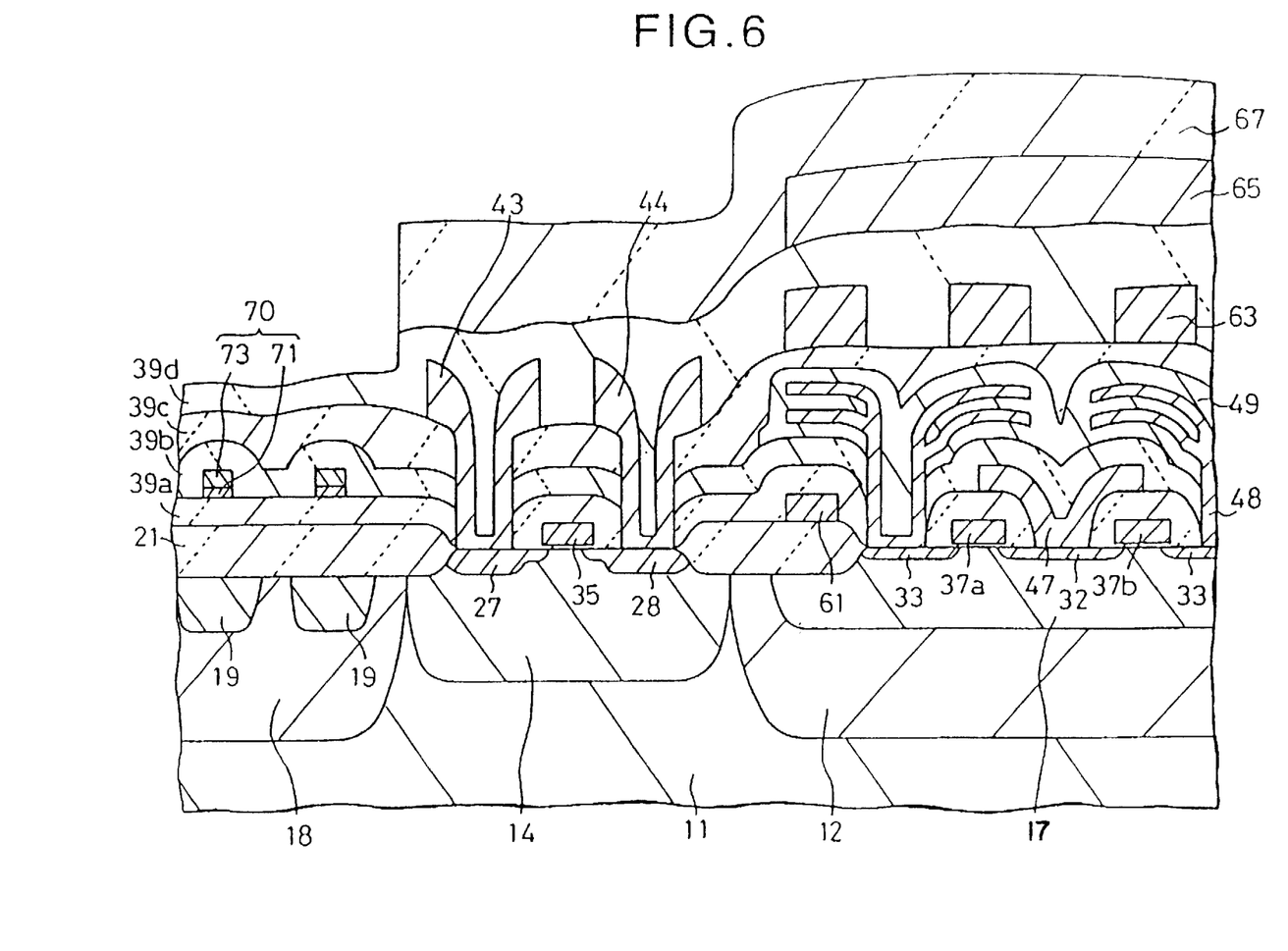
FIG. 6 is a cross sectional view showing another example of the structure of the semiconductor device shown in FIG. 1A.

FIG. 6 is a cross sectional view showing an example of the structure of a semiconductor device including a fuse circuit.

Like the structure shown in FIG. 2, n-type wells 12 and 18 and a p-type well 14 are formed on the main surface of a p-type silicon substrate 11. The n-type well 12 is formed with a p-type well 17 in which memory cells are formed.

In this structure shown in FIG. 6, a plurality of p-type wells 19 having a small surface area are formed in the n-type well 18. These p-type wells 19 are used for preventing short-circuits of fuse elements.

Like the structure shown in FIG. 2, a gate electrode 35 and source/drain regions 27 and 28 are formed on the surface of the p-type well 14. Gate electrodes 37a and 37b and a source region 32 and drain regions 33 are formed in the p-type well 17 in the n-type well 12.

A bit line 47 ohmic-contacted to the source region 32 has a laminated structure of a polycrystalline layer and a tungsten silicide layer formed thereon.

A field oxide film 21 is formed on the surface of the n-type well 18. A first interlevel insulation film 39a is formed on the field oxide film 21. Fuse elements 70 are formed on the first interlevel insulation film 39a. Each fuse element 70 has a laminated structure of a polycrystalline silicon layer 71 and a tungsten silicide layer 73 formed thereon, same as the structure of the bit line.

A second interlevel insulation film 39b is formed on the second level polycrystalline silicon layer. Opposing electrodes 48 and 49 of memory cell capacitors are formed on the second interlevel insulating film 39b. In FIG. 6, the electrode 48 has two fins different from the electrode 48 shown in FIG. 2 which has only one fin. One of the electrode structures is used in each memory device.

A third interlevel insulation film 39c is formed over the opposing electrodes 48 and 49. Source/drain electrodes 43 and 44 made of tungsten are formed passing through the first to third interlevel insulation films and reaching the source/ drain regions 27 and 28. In the memory cell region, a wiring pattern 63 made of tungsten is formed.

A fourth interlevel insulation film 39d is formed over the tungsten wiring pattern. An Al wiring layer 65 is formed on the fourth interlevel insulation film 39d. A cover film 67 having a laminated structure of a nitride film and a phosphosilicate glass film is formed over the Al wiring layer 65. The cover film 67 at the fuse region is removed.

The same doses as those used for the structure shown in FIG. 2 are used for the structure of FIG. 6.

With this structure shown in FIG. 6, the thick field oxide film 21 is formed under the fuse elements 70. Therefore, even if the field oxide film 21 is thermally damaged, electrical connection of the fuse elements 70 to the semiconductor surface scarcely occurs.

Even if the field oxide film 21 under the fuse elements are destructed, there is the p-type wells 19 electrically separated so that electrical isolation between fuse elements can be retained.

Figure 7A:
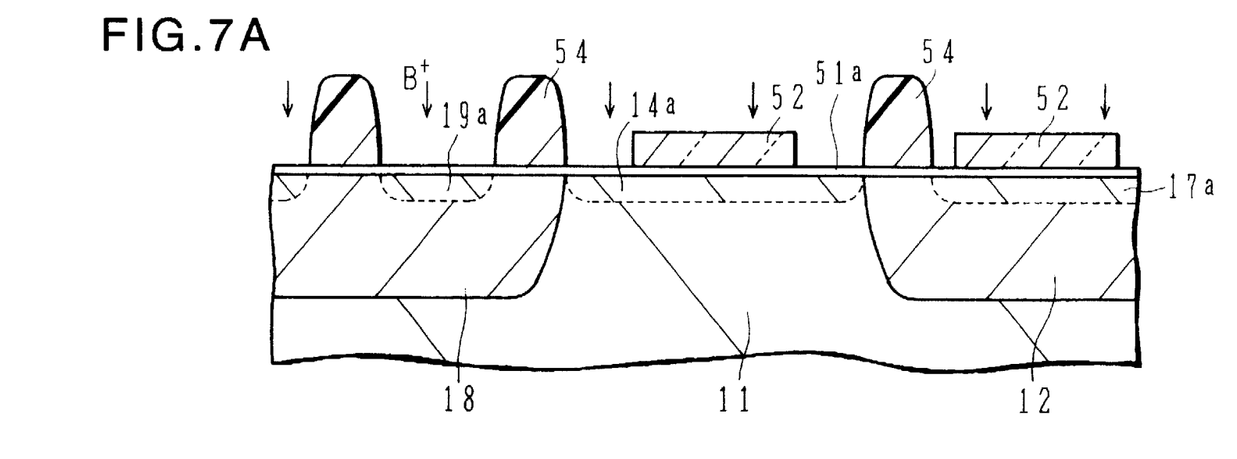
FIGS. 7A and 7B are cross sectional views explaining a process of realizing the structure shown in FIG. 6.

The processes of forming a fuse region will be briefly described with reference to FIGS. 7A and 7B. FIG. 7A corresponds to FIG. 3C. After the n-type wells 12 and 18 are formed in the p-type silicon substrate 11, a resist mask 54 is formed over the substrate 11.

By using this resist mask 54 as an ion implanting mask, B ions are implanted to form B ion implanted regions 14a, 17a, and 19a. After the ion implantation, the resist mask 54 is removed.

Figure 7B:
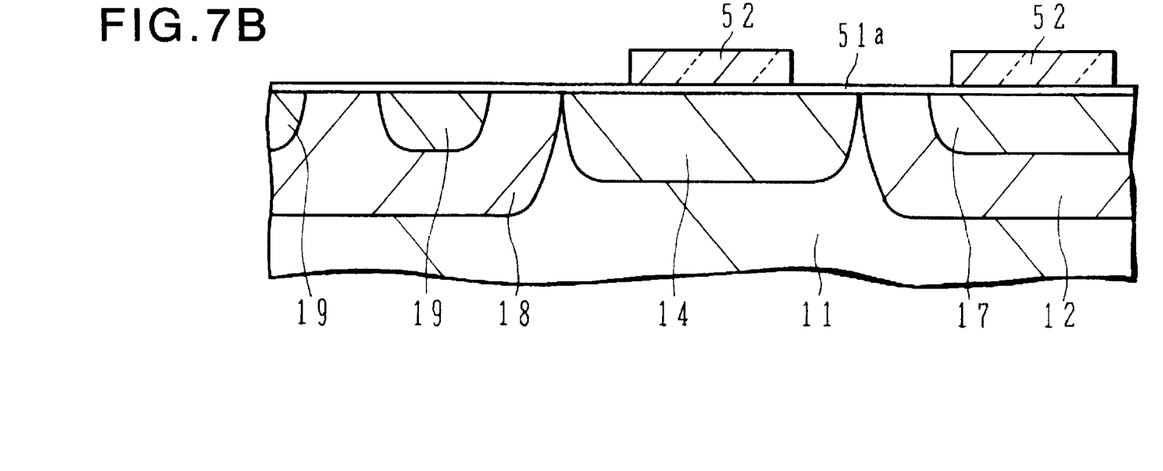

Next, as shown in FIG. 7B, the silicon substrate 11 undergoes a thermal treatment for 60 minutes at a temperature of 1150° C. in a nitrogen atmosphere, to thereby diffuse implanted B ions and form p-type wells 14, 17, and 19.

The processes illustrated in FIGS. 7A and 7B are the same processes as illustrated in FIG. 3C and FIG. 4A.

If a fuse element is to be integrated with a different type of a semiconductor device, it is obvious that the structure of, and processes for, the fuse element may be changed depending upon the requirements of other circuit elements of the semiconductor device.

Figure 8A:
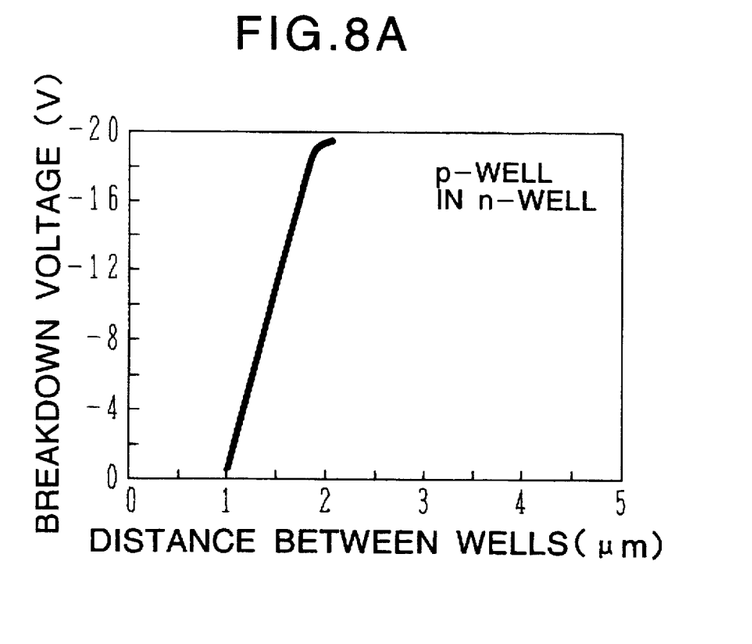
FIGS. 8A and 8B are graphs explaining the characteristics of the structure shown in FIG. 6.
Figure 8B:
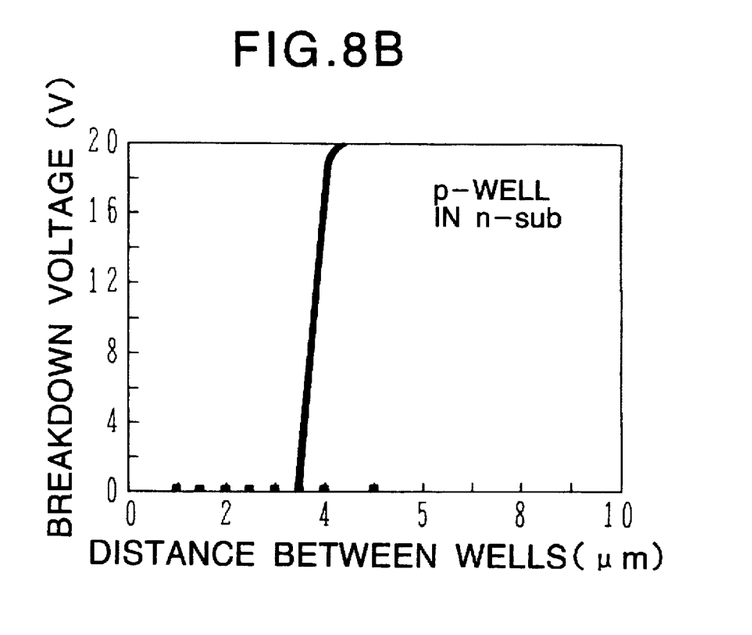

FIGS. 8A and 8B are graphs showing a breakdown voltage between p-type wells, using a distance between p-type wells as a parameter. FIG. 8A is a graph showing a breakdown voltage between p-type wells in an n-type well. The abscissa represents a distance between wells in μm, and the ordinate represents a breakdown voltage in V.

FIG. 8B is a graph showing a breakdown voltage between p-type wells directly formed in an n-type substrate according to a prior art. The abscissa and ordinate of FIG. 8B are the same as FIG. 8A.

From a comparison between the characteristics shown in FIGS. 8A and 8B, it can be seen that even a short distance between wells of the structure shown in FIG. 6 can provide a high breakdown voltage. For example, the conventional structure requires a distance of about 4 μm between wells in order to provide a breakdown voltage of about 12 V, whereas the structure shown in FIG. 6 requires a distance of about 1.5 μm.

By disposing fuse elements over the double well structure formed in a semiconductor substrate, a breakdown voltage can be raised and an integration density of fuse elements can be improved.

The present invention has been described in connection with the preferred embodiments. The invention is not limited only to the above embodiments. It is apparent to those skilled in the art that various modifications, improvements, combinations and the like can be made without departing from the scope of the appended claims.

We claim:

1. A semiconductor device having memory cells for storing data, a sense amplifier circuit for detecting and amplifying memory cell data, and a peripheral circuit for controlling the memory cells and the sense amplifier circuit, the semiconductor device comprising:

a semiconductor substrate of a first conductivity type having a main surface;

a first well region formed in the main surface of said semiconductor substrate, said first well region being of a second conductivity type opposite to the first conductivity type;

a second well region formed in the main surface of said semiconductor substrate at the outside of said first well region, said second well region being of the first conductivity type;

a third well region formed on the main surface of said semiconductor substrate at the inside of said first well region, said third well region being of the first conductivity type;

a fourth well region formed in the main surface of said semiconductor substrate in said first well region, said fourth well region being of the first conductivity type and having an impurity concentration and a depth approximately the same as said third well region;

a first peripheral circuit region including a metal insulator-semiconductor transistor formed in said second well region; and a sense amplifier circuit region including a metal-insulator-semiconductor transistor formed in said third well region.

2. A semiconductor device according to claim 1, wherein said third well region has a net impurity concentration lower than said second well region by an amount approximately equal to an impurity concentration of said first well region.

3. A semiconductor device according to claim 1, wherein said third well region is shallower than said second well region.

4. A semiconductor device according to claim 1, further comprising a plurality of memory cells including a metal-insulator-semiconductor transistor formed in said fourth well region.

5. A semiconductor device according to claim 4, further comprising a fifth well region formed in the main surface of said semiconductor substrate at the outside of said first and second well regions, said fifth well region being of the second conductivity type and having an impurity concentration and a depth approximately the same as said first well region.

6. A semiconductor device according to claim 5, further comprising a plurality of sixth well regions formed in said fifth well region, each of said sixth well regions being of the first conductivity type and having an impurity concentration and a depth approximately the same as said third well region.

7. A semiconductor device according to claim 6, further comprising:
an insulation film formed over said fifth well region; and
a fuse formed over said insulation film and one of said sixth well regions.

8. A semiconductor device according to claim 7, further comprising:
a seventh well region formed in the main surface of said semiconductor substrate at the outside of said first and second well regions, said seventh well region being of the second conductivity type; and
a second peripheral circuit region including a metal-insulator-semiconductor transistor formed in said seventh well region.

9. A semiconductor device according to claim 8, wherein said first and second peripheral circuit regions form a complementary metal-insulator-semiconductor circuit region.

10. A semiconductor device according to claim 9, wherein the metal-insulator-semiconductor transistor of said sense amplifier circuit region have a longer channel length than the metal-insulator-semiconductor transistor of said first peripheral circuit region.

11. A semiconductor device comprising:
a semiconductor substrate of a first conductivity type having a main surface;
a first well region being of a second conductivity type opposite to the first conductivity type;
a plurality of second well regions of the first conductivity type formed in said first well region;
an insulation film formed on the main surface of said semiconductor substrate over said first well region; and
fuses formed on said insulation film over at least some of said second well regions.

12. A semiconductor device according to claim 11, further comprising a third well region formed in the main surface of said semiconductor substrate at the outside of said first well region, said third well region being of the first conductivity type.

13. A semiconductor device according to claim 12, further comprising:
a fourth well region of the second conductivity type formed at the outside of said third and first well regions; and a complementary metal-insulator-semiconductor circuit including metal-insulator-semiconductor transistors formed in said third and fourth well regions.

14. A semiconductor device according to claim 13, further comprising:
a fifth well region formed in the main surface of said semiconductor substrate at the outside of said first, third, and fourth well regions, said fifth well region being of the second conductivity type;
a sixth well region of the first conductivity type formed in said fifth well region; and
memory cells including a MOS transistor formed in said sixth well region.

15. A semiconductor device having memory cells for storing data, a sense amplifier circuit for detecting and amplifying memory cell data, and a peripheral circuit for controlling the memory cells and the sense amplifier circuit, the semiconductor device comprising:
a semiconductor substrate of a first conductivity type having a main surface;
a first well region formed in the main surface of said semiconductor substrate, said first well region being of a second conductivity type opposite to the first conductivity type;
a second well region formed in the main surface of said semiconductor substrate at the outside of said first well region, said second well region being of the first conductivity type;
a third well region formed in the main surface of said semiconductor substrate at the inside of said first well region, said third well region being of the first conductivity type;
a fourth well region formed in the main surface of said semiconductor substrate at the outside of said first and second well regions, said fourth well region being of the second conductivity type and having an impurity concentration and a depth approximately the same as said first well region;
a first metal-insulator-semiconductor transistor of said second conductivity type formed in said second well region;
a second metal-insulator-semiconductor transistor of said first conductivity type formed in said fourth well region; and
a third metal-insulator-semiconductor transistor of said second conductivity type formed in said third well region and constituting a sense amplifier.

16. A semiconductor device according to claim 15, wherein said third well region has a net impurity concentration lower than said second well region by an amount approximately equal to an impurity concentration of said first well region.

17. A semiconductor device according to claim 15, wherein said third well region is shallower than said second well region.

18. A semiconductor device according to claim 15, further comprising a fifth well region formed in the main surface of said semiconductor substrate in said first well region, said fifth well region being of the first conductivity type and having an impurity concentration and a depth approximately the same as said third well region.

19. A semiconductor device according to claim 18, further comprising a plurality of memory cells including metal-insulator-semiconductor transistors formed in said fifth well region.

20. A semiconductor device having memory cells for storing data, a sense amplifier circuit for detecting and amplifying memory cell data, and a peripheral circuit for controlling the memory cells and the sense amplifier circuit, the semiconductor device comprising:
a semiconductor substrate of a first conductivity type having a main surface;
a first well region formed in the main surface of said semiconductor substrate, said first well region being of a second conductivity type opposite to the first conductivity type;
a second well region formed in the main surface of said semiconductor substrate at the outside of said first well region, said second well region being of the first conductivity type;
a third well region formed in the main surface of said semiconductor substrate at the inside of said first well region, said third well region being of the first conductivity type;

a fourth well region of said second conductivity type, formed in the main surface of said semiconductor substrate at the outside of said first and second well regions, the fourth well region having approximately the same depth and impurity concentration as those of the first well region; and a fifth well region formed in the main surface of said semiconductor substrate in said first well region, said fifth well region being of the first conductivity type and having an impurity concentration and a depth approximately the same as said third well region;

wherein the impurity concentration of the first conductivity type doped in said second well region is physically the same as that doped in said third well region, and the electrical impurity concentration of the second well region is higher than that of the third well region.

21. A semiconductor device according to claim 20, further comprising a plurality of memory cells including a metal-insulator-semiconductor transistor formed in said fifth well region.

22. A semiconductor device having memory cells for storing data, a sense amplifier circuit for detecting and amplifying memory cell data, and a peripheral circuit for controlling the memory cells and the sense amplifier circuit, the semiconductor device comprising:

a semiconductor substrate of a first conductivity type having a main surface;

a first well region formed in the main surface of said semiconductor substrate, said first well region being of a second conductivity type opposite to the first conductivity type;

a second well region formed in the main surface of said semiconductor substrate at the outside of said first well region, said second well region being of the first conductivity type;

a third well region formed in the main surface of said semiconductor substrate at the inside of said first well region, said third well region being of the first conductivity type;

a fourth well region of said second conductivity type, formed in the main surface of said semiconductor substrate at the outside of said first and second well regions, the fourth well region having approximately the same depth and impurity concentration as those of the first well region; and a fifth well region formed in the main surface of said semiconductor substrate at the outside of said first, second and fourth well regions, said fifth well region being of the second conductivity type and having an impurity concentration and a depth approximately the same as said first well region;

wherein the impurity concentration of the first conductivity type doped in said second well region is physically the same as that doped in said third well region, and the electrical impurity concentration of the second well region is higher than that of the third well region.

23. A semiconductor device according to claim 22, further comprising a plurality of sixth well regions formed in said fifth well region, each of said sixth well regions being of the first conductivity type and having an impurity concentration and a depth approximately the same as said third well region.

24. A semiconductor device according to claim 23, further comprising:

an insulation film formed over said fifth well region; and a fuse formed over said insulation film and one of said sixth well regions.

25. A semiconductor device having memory cells for storing data, a sense amplifier circuit for detecting and amplifying memory cell data, and a peripheral circuit for controlling the memory cells and the sense amplifier circuit, the semiconductor device comprising:

a semiconductor substrate of a first conductivity type having a main surface;

a first well region formed in the main surface of said semiconductor substrate, said first well region being of a second conductivity type opposite to the first conductivity type;

a second well region formed in the main surface of said semiconductor substrate at the outside of said first well region, said second well region being of the first conductivity type;

a third well region formed in the main surface of said semiconductor substrate at the inside of said first well region, said third well region being of the first conductivity type;

a fourth well region of said second conductivity type, formed in the main surface of said semiconductor substrate at the outside of said first and second well regions, the fourth well region having approximately the same depth and impurity concentration as those of the first well region;

a first peripheral circuit region including a metal-insulator-semiconductor transistor formed in said second well region; and a sense amplifier circuit region including a metal-insulator-semiconductor transistor formed in said third well region;

wherein the impurity concentration of the first conductivity type doped in said second well region is physically the same as that doped in said third well region, and the electrical impurity concentration of the second well region is higher than that of the third well region.

26. A semiconductor device according to claim 25, wherein the metal-insulator-semiconductor transistor of said sense amplifier circuit region has a longer channel length than the metal-insulator-semiconductor transistor of said first peripheral circuit region.

* * * * *